United States Patent [15] 3,663,868
Noguchi et al. [45] May 16, 1972

[54] HERMETICALLY SEALED SEMICONDUCTOR DEVICE

[72] Inventors: Shozo Noguchi; Yoshiyuki Nanko, both of Tokyo, Japan

[73] Assignee: Nippon Electric Co., Ltd., Tokyo, Japan

[22] Filed: Oct. 16, 1970

[21] Appl. No.: 81,464

[30] Foreign Application Priority Data

Oct. 17, 1969 Japan....................................44/82769

[52] U.S. Cl.....................317/234 R, 317/234 A, 317/234 F, 317/234 G, 317/234 N, 174/52
[51] Int. Cl...............................................H01l 3/00, H01l 5/0
[58] Field of Search......................317/234, 235, 1, 3, 3.1, 4, 317/4.1, 5, 5.2, 5.3, 5.4; 174/52, 3 FP; 29/589

[56] References Cited

UNITED STATES PATENTS 3,195,026 7/1965 Wegner et al..........................317/234
3,202,888 8/1965 Evander et al.........................317/234
3,234,320 2/1966 Wong..................................317/234
3,303,265 2/1967 Noren et al...........................317/234
3,478,161 11/1969 Carley...............................317/234

FOREIGN PATENTS OR APPLICATIONS 785,971 11/1957 Great Britain.........................317/234

*Primary Examiner*—John W. Huckert
*Assistant Examiner*—Andrew J. James
*Attorney*—Sandoe, Hopgood and Calimafde

[57] ABSTRACT

A hermetically sealed container for a semiconductor device or the like comprises a peripheral wall portion surrounding the semiconductor device and secured, such as by brazing, at its lower end to an insulating substrate. The upper section of the wall portion is thicker than its lower portion to thereby permit increased mechanical contact strength.

6 Claims, 4 Drawing Figures

INVENTORS
SHOZO NOGUCHI
BY YOSHIYUKI NANKO

Sandoe, Hopgood & Calimafde
ATTORNEYS

HERMETICALLY SEALED SEMICONDUCTOR DEVICE

BACKGROUND OF THE INVENTION

This invention relates generally to hermetically sealed semiconductor devices and, more particularly, to an improved container structure for a semiconductor device adapted for high frequency applications and featured by a reliable hermetic seal with improved mechanical strength.

A typical structure of a conventional container for a semiconductor device is composed of a beryllia ceramic which is an insulator having a high thermal conductivity. The beryllia ceramic forms a substrate for providing heat dissipation of the semiconductor element disposed thereon. For this purpose. the cylindrical wall portion of the ceramic is disposed on the substrate so as to surround the semiconductor chip while its cover portion is disposed on the upper surface of the wall portion. Electrode leads are attached under the substrate and are electrically connected to the electrode of the semiconductor chip through metallized holes provided in the substrate.

To insure optimum high frequency performance with the conventional semiconductor device, several problems must be overcome. One of these problems is the necessity for minimizing the equivalent inductance from the semiconductor chip to the external circuitry. To meet this requirement, the container for the semiconductor device must be as compact as possible. In particular, the thickness of the wall portion must be minimized. These conditions have thus far rendered production of a reliable hermetic seal extremely difficult because of the restriction imposed on the contact area that can be used for brazing between the wall portion and the substrate, or between the wall portion and the cover portion.

In the fabrication of this conventional semiconductor device, it has been the common practice to establish a brazed joint at the substrate and the ring prior to the mounting of the semiconductor chip on the surface of the substrate. The brazing temperature may be considerably high. Accordingly, a reliable hermetic seal can be achieved, even if the contact area for brazing is small, by the use of a solder having a high melting point and a strong brazing withstanding property, such as a silver-copper eutectic solder. In general, a solder of high brazing withstanding property has a high melting point.

However, the brazing of the wall and the cover portions of the ceramic must be performed after the semiconductor chip has been mounted on the substrate. The brazing temperature must therefore be lower than the point at which the impurity of the element starts to rediffuse. Therefore, the solder must have a low melting point. This results in a low brazing withstanding property of this solder. Accordingly, in the conventional hermetically sealed semiconductor device, the thickness of the wall portion must be unavoidably great to obtain the adequate brazing withstanding property, and the container is larger despite the limited space available for the semiconductor chip.

Furthermore, in the conventional housing element of this type, there is a tendency for a gap to be formed between the cover portion and the wall portion due to the lack of mechanical strength, attributable to the poor brazing resisting property and small brazing area.

OBJECTS OF THE INVENTION

Accordingly, it is an object of the present invention to provide a miniaturized and hermetically housed semiconductor device for high frequency applications.

It is another object of the invention to provide an improved hermetically sealed semiconductor device having increased mechanical strength and compactness.

It is a further object of the invention to provide a hermetically sealed semiconductor device of the type described which can be readily and economically fabricated.

An outstanding structural feature of the semiconductor device of the present invention is that the thickness of the upper surface of the ring-shaped wall portion is broader than that of the lower surface, so that the brazing withstanding property of the wall and cover portions may be sufficiently high.

The hermetic seal structure of this invention is easy to manufacture and permits the formation of a substantially perfect hermetic seal. Moreover, the mechanical contact strength between the members of the container is sufficiently high, due to the fact that the contact area between the wall and cover portions is sufficiently broad to maintain this contact. Furthermore, the surface area of the substrate surrounded by the wall portion is broad compared with the conventional hermetic seal structure. Further, the semiconductor device of this invention is well adaptable to use in highly reliable semiconductor devices for operation in high frequency applications due to the compactness of this device.

To the accomplishment of the above and to such further objects as may hereinafter appear, the present invention relates to a hermetically sealed semiconductor device substantially as defined in the appended claims and as described in the accompanying specification taken together with the accompanying drawings in which:

DETAILED DESCRIPTION OF THE INVENTION

Figure 1:
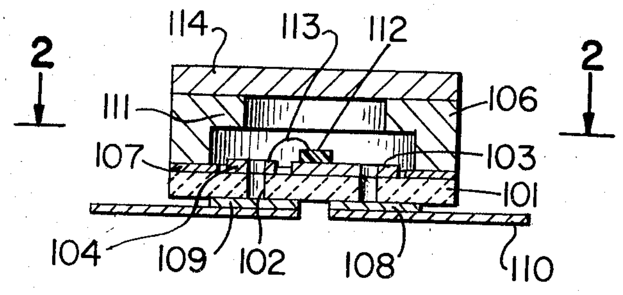
FIG. 1 is a vertical cross-section view of a hermetically sealed container for a semiconductor device according to one embodiment of this invention.
Figure 2:
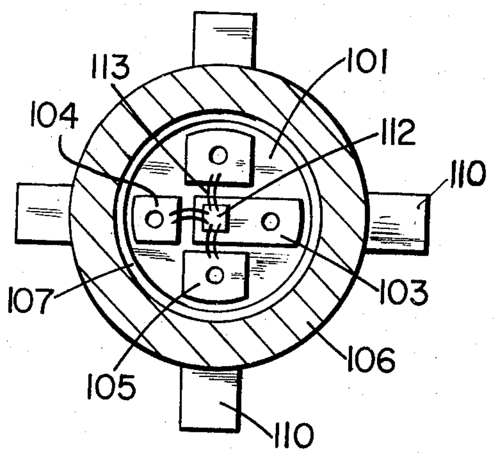
FIG. 2 is a transverse cross-sectional view of the semiconductor device of FIG. 1 taken along the line 2—2 in FIG. 1.

Referring to the hermetically housed semiconductor device shown in FIGS. 1 and 2, a substrate 101 of an insulating material having a high thermal conductivity, such as beryllia ceramic, is provided with a plurality of holes 102, each of which has a metallized layer 109 formed over its inner surface. A metallic layer formed on the upper surface of substrate 101 consists of a metallized pattern 103 for the collector electrode, a metallized pattern 104 for the base electrode, metallized patterns 105 for the emitter electrode, and a ring-shaped metallized pattern 107 on which a ring 106 is to brazed. Four metallized patterns 108 are formed on the bottom surface of the substrate 101 and each pattern 108 is disposed on the bottom surface of the substrate to respectively surround each hole 102 in substrate 101.

Conducting leads 110 made of copper or an iron-cobalt-nickel alloy (Covar) are respectively brazed to metallized patterns 108 to constitute a substantially coplanar array of radially disposed strips extending from the bottom surface, as seen best in FIG. 2.

Ring 106, made of an iron-nickel alloy, an iron-cobalt-nickel alloy (Covar), an insulating material such as alumina, or the like, is formed such that its upper annular surface is broader than its lower surface. For instance, ring 106 may be formed as shown in FIG. 1, by attaching a stepped portion 111 to the inner, upper surface of the ring. Ring 106 is brazed to the metallized pattern 107. Thereafter, a semiconductor chip 112 is mounted on metallized pattern 103 and the emitter and base electrodes of a semiconductor chip 112 are respectively electrically connect to metallized patterns 105 and 104 by means of thin wires 113 made of aluminum or gold bonded to and extending between chip 112 and metallized patterns 104 and 105.

Finally, a cover 114 made of a metal or a ceramic material (with a metallic layer formed on the lower surface in the case of a ceramic material) is brazed to the upper surface of ring 106 to complete the hermetically sealed enclosure.

According to this embodiment, a more reliable hermetic seal having improved mechanical strength is achieved because the inner surface of ring 106 is stepped, resulting in a larger brazing contact area between the ring and the cover.

Figure 3:
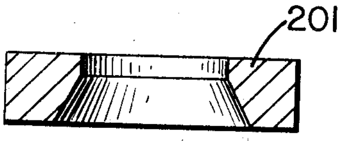
FIG. 3 is a cross-sectional view of an alternate example of a ring-shaped wall element for use in the container of the invention.
Figure 4:
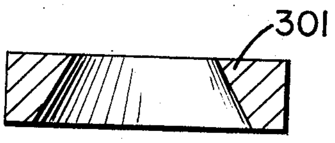
FIG. 4 is a view similar to FIG. 3, illustrating yet another example of a ring-shaped wall element.

Instead of being stepped as shown in the embodiment of FIG. 1, the inner surface of the ring may be sloping as shown by a ring 301 in FIG. 4, or may be a combination of both as shown by a ring 201 in FIG. 3 in order to obtain the effects comparable to the embodiment of this invention, shown in FIGS. 1 and 2.

It will be obvious that the wall portion described by ring 106 in the above embodiment may be a ring of size, dimension and proportion different from that described above. It may generally be a collar with any suitable planar configuration such as square or rectangular. In those cases, the thickness of the upper surface should be broader than that of the lower surface.

Although the invention has been described with reference to a specific hermetically housed container for a semiconductor device, it will also be obvious that this invention is equally applicable to any other container structure. More specifically, the conducting leads may be led out through the seam between the wall and the substrate, rather than as herein specifically described.

Thus, while only several embodiments of the present invention have been herein specifically described, it will be apparent that modifications may be made therein without departing from the spirit and the scope of the invention.

We claim:

1. A hermetically sealed container for a semiconductor device comprising an insulating substrate for supporting a semiconductor chip thereon, at least one conducting lead adhered to said substrate for providing an electrical connection from said semiconductor chip to an external circuit, a wall portion having upper and lower sections and surrounding said semiconductor chip, said wall portion being in the form of a hollow cylinder, said upper wall section having an inwardly extending portion along the axis of said wall portion, said lower section being secured to said substrate, and a cover plate adhered to the increased thickness upper section of said wall portion.

2. The hermetically sealed container as claimed in claim 1, wherein said substrate has at least one metallized opening formed therein, said lead being secured to the outer surface of said substrate and electrically connected to at least one electrode of said semiconductor chip through said metallized opening.

3. The hermetically sealed container as claimed in claim 1, wherein the inner diameter of said inwardly extending portion decreases in a stepwise manner toward said upper section.

4. The hermetically sealed container as claimed in claim 1, wherein said wall portion has an upwardly and inwardly sloping surface to make the thickness at the upper end of said wall portion greater than the thickness at its lower end and to thereby define said increased thickness upper section.

5. The hermetically sealed container as claimed in claim 1, further comprising a conducting peripheral element secured to said substrate, said lower section of said wall portion being bonded to said peripheral element.

6. The hermetically sealed container as claimed in claim 2, further comprising a conducting region secured to the outer surface of said substrate, surrounding the lower end of said metallized opening, and electrically coupled to said lead.

* * * * *